June 9, 1964 W. H. WOODWORTH 3,136,848

VIDICON WITH LOW IMPEDANCE AMPLIFIER FOR EXTENDED HIGH FREQUENCY RESPONSE AND IMPROVED SIGNAL TO NOISE RATIO

Filed July 13, 1960

INVENTOR.
WILLIAM H. WOODWORTH
BY
P. K. Fircht
C. P. B. Curry
ATTORNEYS

United States Patent Office 3,136,848 Patented June 9, 1964

3,136,848

VIDICON WITH LOW IMPEDANCE AMPLIFIER FOR EXTENDED HIGH FREQUENCY RESPONSE AND IMPROVED SIGNAL TO NOISE RATIO

William H. Woodworth, China Lake, Calif., assignor to the United States of America as represented by the Secretary of the Navy Filed July 13, 1960, Ser. No. 42,729
2 Claims. (Cl. 178—7.2)
(Granted under Title 35, U.S. Code (1952), sec. 266)

The invention herein described may be manufactured and used by or for the Government of the United States of America for governmental purposes without the payment of any royalties thereon or therefor.

The present invention relates to a vidicon and amplifier circuit combination for operation with high frequency low current signals and particularly to such a vidicon and amplifier circuit combination which provides minimum attenuation at high frequencies.

The current output of vidicons, photo-multipliers, photo-cells and other similar devices is of a relatively low order of magnitude of approximately $1\times10^{-6}$ amperes. Prior methods of amplifying signals of this order of magnitude have been by means of vacuum tubes wherein a resistor in series with the signal source was included in shunt with the grid-cathode impedance, yielding suitable voltage division to provide an adequate grid signal. Transistor circuitries which have been used for amplification of signals of this magnitude have been developed by one-to-one substitution for the vacuum tubes wherein this substitution has resulted in the use of a load resistor in series with the emitter (equivalent to the grid-cathode impedance) and the use of a shunting resistor in series with the signal source.

These prior methods are satisfactory so long as the frequency of the output signal is of a relatively low order of magnitude since there will be negligible attenuation. However, when it is desirable to amplify signals of a higher order of frequency magnitude there is attenuation and a resultant reduction of the signal to noise ratio. This higher-frequency attenuation results from the presence of the shunting resistor in parallel with the small current signal to be amplified wherein the resistor is unavoidably shunted by the output capacitance of the signal source, the input capacitance of the amplifier and the lead wire capacitance. In these prior devices, to obtain an acceptable signal to noise ratio by having a sufficiently large voltage at the control element of the tube or transistor, the effective load resistance in series with the small current signal source must be of a relatively large order of magnitude. By employing such resistance of relatively large magnitude, which is shunted by the above mentioned unavoidable capacitance, the frequency at which attenuation occurs is of comparatively low value. Since it is frequently necessary to operate at higher frequencies it has been found necessary to employ high peaking circuits. By using high peaking circuits it is possible to obtain a predetermined voltage throughout the entire frequency range by providing a constant impedance in the range of negligible attenuation and a decreasing impedance with increasing frequency in the attenuation range. An example of one type of peaking circuitry is illustrated in RCA Review, volume XVII, Number 2, March 1956, page 485. It should be particularly noted that by operating in the attenuation range there is a highly undesirable reduction in the signal to noise ratio. Although high peaking circuits provide means by which a constant voltage output is obtained throughout the entire frequency range they do not improve the low signal to noise ratio at frequencies in the attenuation region.

The present invention provides a system wherein a constant voltage output is obtained through the entire operating frequency range and the maximum available signal to noise ratio is realized. This is accomplished by applying the output signal of a low current source directly to a current sensitive low impedance transistor. Since the input impedance of the transistor is very low (0–200 ohms) and shunts the unavoidable circuit capacitance, there results a greatly extended high frequency response since attenuation occurs at a much higher frequency. Because operation is not in the attenuation region, a constant voltage output is obtained throughout the entire frequency range, without the necessity of employing high peaking circuits, and the maximum available signal to noise ratio is realized.

An object of the present invention is to provide amplification of high frequency low current signals without attenuation resulting from the use of a load resistor in series with the signal source.

Another object is to provide a low input impedance transistor amplifier for amplification of low current high frequency signals wherein maximum available signal to noise ratio is obtained throughout the operating frequency range.

Another object is to connect the output of a low current high frequency source directly to a current sensitive amplifier wherein the input impedance of the amplifier is very low and shunts all input circuit capacitances, resulting in greatly extended high frequency response.

Other objects and many of the attendant advantages of this invention will become readily appreciated as the same becomes better understood by reference to the following detailed description when considered in connection with the accompanying drawings wherein.

In order to clearly understand the unique advantages of the instant invention it is well to consider it in conjunction with conventional systems and the problems associated therewith. In the following analysis it should be particularly noted that the amplifier is used to amplify a high frequency low current signal. It is considered that the hereinafter described invention is uniquely applicable to a signal of this type and it has overcome major disadvantages of prior systems.

When the signal to be amplified has a current of a relatively large order of magnitude, the prior systems have proved adequate since the frequency at which attenuation occurs may be increased by decreasing the value of the resistance in series with the signal. Likewise, the prior systems have proved adequate when the current is small and the frequency is low since at low frequencies there will be negligible attenuation. However, when the current is small and the frequency is high, the prior systems have proved inadequate since there is considerable attenuation and reduction of the signal to noise ratio.

Figure 1:
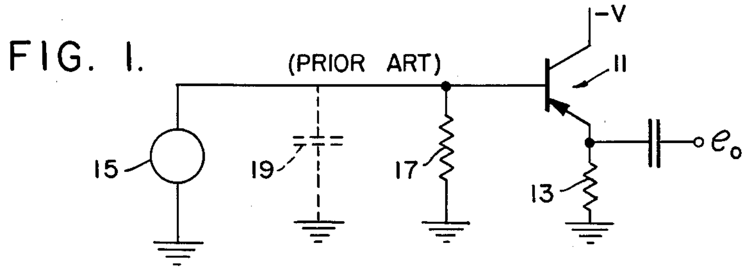
FIG. 1 is a schematic diagram of a conventional amplifier of low current high frequency signals.

Referring now to FIG. 1 there is shown a typical transistor circuit that has been used for amplification of high frequency low current signals. As shown, transistor 11 is of the emitter-follower type wherein the output voltage $e_0$ appears across load resistor 13. Load resistor 13 is comparatively large and, including the base-emitter resistance, corresponds to the grid-cathode impedance of a vacuum tube; shunted by resistor 17, the resultant voltage division with device 15 makes the base signal of sufficient magnitude. The high frequency low current output signal of device 15 is applied to the base of transistor 11 and in parallel with resistor 17. It should be particularly noted that resistor 17 is unavoidably shunted by the output capacitance of device 15, the input capacitance of transistor 11 and the internal capacitance of the lead wires. These capacitances are shown in dotted lines as equivalent capacitor 19. The signal applied to the base of transistor 11 must have a magnitude of approximately .05 volt in order to provide an acceptable signal to noise ratio and since the current output of device 15 is approximately $1\times10^{-6}$ amperes it is necessary that resistor 17 have a value of approximately 50,000 ohms.

Figure 2:
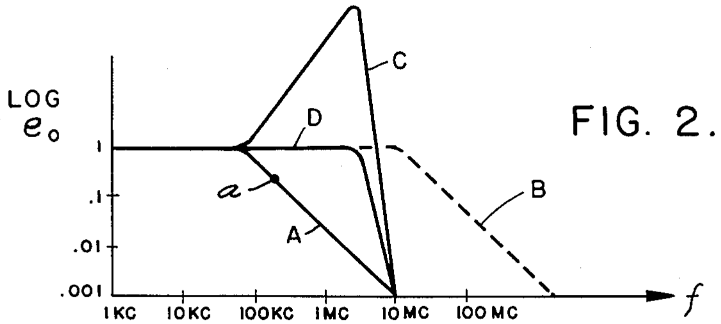
FIG. 2 is a log-log plot of the output signal of the circuits shown in FIGS. 1, 3 and 4.

In FIG. 2 is shown a log-log plot of the output voltage $e_0$ versus the output frequency of signal device 15. Curve A is a plot of the FIG. 1 device which can be determined from actual measurements or from the relation $$e_0=I_s\left[\frac{-R_L\left(\frac{\partial}{wC}\right)}{R_L-\frac{\partial}{wC}}\right] \qquad (1)$$

where $\partial$ is $\sqrt{-1}$, $w=2\pi f$, $R_L$ is the value of resistor 17 (50,000 ohms), $I_s$ is the output current of signal device 15 and C is the value of effective capacitor 19.

The relationship $$f_c=\frac{1}{2\pi R_L C} \qquad (2)$$

defines that frequency where the impedance of $R_L$ and C are equal and where the current through $R_L$ is .707 times the current therethrough if capacitor 19 (C) were not included in the circuit. The attenuation at this frequency is indicated at point "*a*" in the attenuation region of curve A of FIG. 2.

By virtue of the above and especially by examination of Equation 2 it can be seen that as the value of resistor 17 ($R_L$) decreases, attenuation occurs at higher frequencies as indicated by curve B of FIG. 2. It is undesirable to operate in the attenuation region and especially at frequencies much above that at point "*a*" since the reduced signal to noise ratio becomes critical. However, the frequency at which attenuation occurs cannot be appreciably increased since the value of resistor 17 of the circuit of FIG. 1 cannot be appreciably reduced because it is necessary to provide sufficient voltage at the base of transistor 11 as previously explained.

Figure 3:
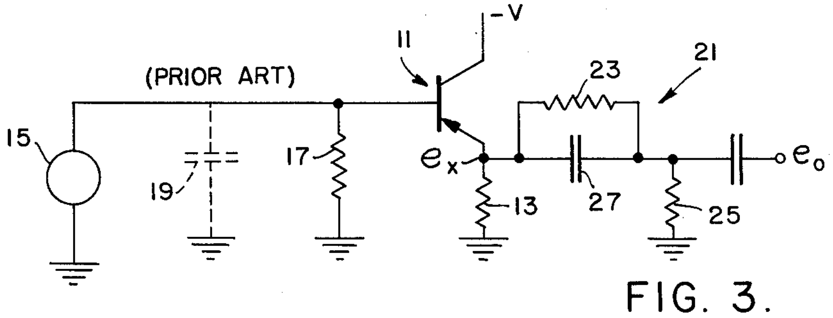
FIG. 3 is a schematic diagram of the conventional amplifier of FIG. 1 and a conventional high peaking circuit to compensate for attenuation of the amplifier.

A high peaking circuit of the type generally indicated at 21 in FIG. 3 is frequently employed to correct for the attenuation of the FIG. 1 device. High peaking circuit 21 includes resistors 23 and 25 and capacitor 27 and provides a voltage-frequency plot as indicated by curve C of FIG. 2. The logarithmic addition of the voltages of curves A and C results in curve D which is linear and provides a constant voltage $e_0$ at frequencies below the maximum operating frequency which in this case is approximately 5 megacycles.

The values of resistors 23 and capacitor 27 are selected so that $$C_1R_1=C(Z_i) \qquad (3)$$

where $c_1$ is the value of capacitor 27, $R_1$ is the value of resistor 23, C is the value of effective capacitor 19 and $Z_i$ is the input impedance at the base of transistor 11. At low frequencies capacitor 27 is not effective since the capacitive reactance of capacitor 27 is large compared to the resistance of resistor 23 and the output voltage $$e_0 \text{ is } e_x\frac{R_1}{R^1+R_2}$$

where $R_2$ is the value of resistor 25 and $e_x$ is the voltage applied to the input of the high peaking circuit. From this it can be seen that transistor 11 must amplify the incoming signal to a value $e_x$, in the non-attenuated as well as attenuated regions, which is considerably greater than the output signal $e_0$ since there is a voltage drop across the peaking circuit. This means either the value of resistor 17 must be increased above the FIG. 1 device to maintain the same value of $e_0$, which decreases the frequency at which attenuation occurs, or the output voltage $e_0$ will be decreased.

Another type of high peaking circuit is shown on page 485 of the RCA Review, volume XVII, March 1956 published by RCA Laboratories wherein the fourth, fifth and sixth stage transistors include emitter peaking circuits to provide improved rising characteristics to the peaking circuits between the fourth and fifth stages. In order to compensate for the impedance variations of the stage, which may result from variable temperatures, the interstage peaking circuits are provided with variable capacitors which are adjusted to compensate for impedance changes.

The present invention provides a unique system wherein there is no attenuation of low current high frequency signals and as a result there is the best possible signal to noise ratio, the output voltage is constant over the entire frequency range and high peaking circuits have been eliminated.

Figure 4:
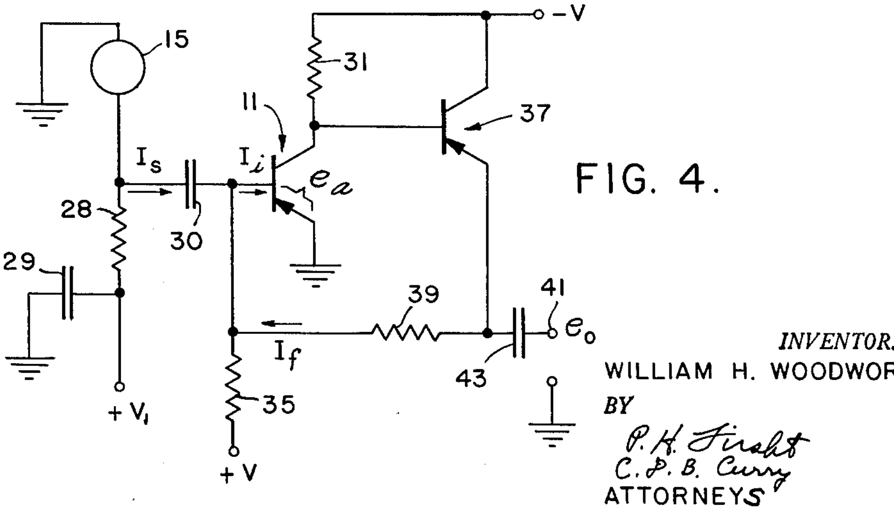
FIG. 4 is a schematic diagram of the low impedance amplifier of the present invention for amplification of low current high frequency signals.

Referring to FIG. 4, the system there shown includes the low current high frequency device 15. The output signal of this device has a frequency which may vary from 100 kilocycles to 100 megacycles and a current of approximately $1\times10^{-6}$ amperes. As shown, device 15 is connected in series with a positive D.C. potential through D.C. bias resistor 28 and is provided an A.C. path through D.C. blocking capacitor 29. The A.C. signal is applied from one side of resistor 28 through coupling and D.C. blocking capacitor 30 to the base of transistor 11. The collector of transistor 11 is connected through load resistor 31 to a negative potential source and the emitter is connected directly to ground. A positive potential is connected through resistor 35 to the base of transistor 11 to provide a positive D.C. bias voltage. Transistor 37 has the base connected directly to the collector of transistor 11, the collector connected to A.C. ground (via the battery connected to the −V terminal), and the emitter connected through resistor 39 to the base of transistor 11. There is a 180° phase shift across transistor 11, and no phase shift across transistor 37 since it is an emitter-follower, which results in degenerative feedback wherein currents $I_s$ and $I_f$ are 180° out of phase. Output voltage terminal 41 is connected through D.C. blocking capacitor 43 to the emitter of transistor 37.

The impedance which device 15 looks into is defined by the relation $$Z_i=\frac{e_a}{I_s}=\frac{I_iZ_+}{I_s} \qquad (4)$$

wherein $Z_i$ is the impedance looking into the base of transistor 11 with degeneration feedback, $e_a$ is the voltage drop across the base-emitter junction of transistor 11, $I_s$ is the output current of device 15, $I_i$ is the current flow into the base of transistor 11 and $Z_+$ is the common-emitter input impedance of transistor 11.

From the above relation it can be seen that the ratio $I_i/I_s$ decreases with degenerative feedback and the degenerative feedback therefore decreases the effective input impedance. Normally the impedance ($Z_+$) across the base-emitter junction is from approximately 500 to 1000 ohms. With generative feedback, the effective impedance ($Z_i$) is reduced to a range of from approximately 0 to 200 ohms.

The input impedance of transistor 11 is very low and it is therefore unnecessary to provide a separate resistor in series with the output signal of device 15 since the voltage at the base of the transistor is sufficient without employing a voltage divider as was necessary in the prior devices shown in FIGS. 1 and 3.

It can therefore be seen that the present invention obviates high frequency losses of low current sources. By examination of Equation 2 and by taking a typical value of 20 micromicrofarads as the unavoidable shunting capacitance, an attenuation frequency ($f_c$) of approximately 150 kilocycles is obtained when the shunting impedance is 50,000 ohms, as in the devices of FIGS. 1 and 3, and a frequency of 53 megacycles when the shunting impedance is 200 ohms as in the FIG. 4 device of the present invention. Therefore the high-frequency roll-off or attenuation is far higher than when a load resistor is employed.

The following table shows by way of example, the values of resistance, bias voltage and capacitance in one embodiment of the network of the present invention:

| Reference Numeral | Unit | Value | Reference Numeral | Unit | Value |
|---|---|---|---|---|---|
| 28 | Ohms | 500,000 | 30 | Microfarads | 2.0 |
| 31 | do | 8,200 | 43 | do | 2.0 |
| 35 | do | 15,000 | $+V_1$ | Volts | 0 to 100 |
| 39 | do | 8,200 | +V | do | +12 |
| 29 | Microfarads | 8.0 | −V | do | −12 |

Obviously many modifications and variations of the present invention are possible in the light of the above teachings. It is to be understood that a degenerative feedback reduces the effective input impedance of the amplifier; however, it should not be limited to this feature in that the low impedance of the first stage transistor alone, greatly extends the unattenuated frequency range of the amplifier. It is therefore to be understood that within the scope of the appended claims the invention may be practiced otherwise than as specifically described.

What is claimed is:

1. A vidicon and amplifier circuit combination for providing extended flat frequency response without deterioration of signal-to-noise ratio, said combination comprising:
   (*a*) a vidicon circuit;
   (*b*) a transistor amplifier characterized by low input impedance of value no greater than the order of two hundred ohms; and
   (*c*) capacitor means establishing a signal current path between said vidicon circuit and said transistor amplifier, said capacitor having suitably large microfarad value to present negligible impedance, relative to said transistor amplifier input impedance, at signal frequencies as great as the order of fifty megacycles per second.

2. A combination as defined in claim 1, wherein said transistor amplifier comprises a common-emitter common-collector pair provided with sufficient degenerative feedback to decrease the effective input impedance of said amplifier to fall within a range extending to an upper value no greater than two hundred ohms.

References Cited in the file of this patent

UNITED STATES PATENTS

| | | |
|---|---|---|
| 2,863,957 | Hamilton | Dec. 9, 1958 |
| 2,889,519 | Montgomery | June 2, 1959 |
| 2,901,556 | Chapman | Aug. 25, 1959 |
| 3,025,472 | Greatbatch | Mar. 13, 1962 |
| 3,040,264 | Weidner | June 19, 1962 |

FOREIGN PATENTS

| | | |
|---|---|---|
| 1,127,774 | France | Dec. 24, 1956 |